United States Patent [19]
Arai et al.

[11] Patent Number: 5,686,758
[45] Date of Patent: Nov. 11, 1997

[54] SEMICONDUCTOR DEVICE HAVING INTEGRAL STRUCTURE OF CASE AND EXTERNAL CONNECTION TERMINALS

[75] Inventors: Kiyoshi Arai; Yoshio Takagi; Tatsuya Iwasa, all of Fukuoka, Japan

[73] Assignee: Mitsubishi Denki Kabushiki Kaisha, Tokyo, Japan

[21] Appl. No.: 441,738

[22] Filed: May 16, 1995

[30] Foreign Application Priority Data

May 31, 1994 [JP] Japan .................................. 6-119019

[51] Int. Cl.⁶ .......................... H01L 25/07; H01L 23/12; H01L 25/18
[52] U.S. Cl. .......................... 257/693; 257/703; 257/668; 257/698; 257/697; 257/707; 257/723; 257/725; 257/712
[58] Field of Search .................................. 257/734, 773, 257/693, 698, 692, 704, 723, 706, 708, 697, 691, 699, 668, 724, 725, 703, 712, 713

[56] References Cited

U.S. PATENT DOCUMENTS

| | | | |
|---|---|---|---|
| 4,920,405 | 4/1990 | Itoh et al. | 257/724 |
| 4,965,710 | 10/1990 | Pelley et al. | 257/713 |
| 5,172,215 | 12/1992 | Koboyashi et al. | 257/724 |
| 5,291,065 | 3/1994 | Arai et al. | 257/723 |
| 5,408,128 | 4/1995 | Furnival | 257/724 |
| 5,444,297 | 8/1995 | Oshima et al. | 257/691 |
| 5,471,089 | 11/1995 | Nagatomo et al. | 257/723 |
| 5,519,252 | 5/1996 | Soyano et al. | 257/691 |
| 5,521,437 | 5/1996 | Oshima et al. | 257/723 |
| 5,559,374 | 9/1996 | Ohta et al. | 257/723 |

FOREIGN PATENT DOCUMENTS

| | | | |
|---|---|---|---|
| 36 21 994 | 1/1988 | Germany. | |
| 42 34 506 | 4/1993 | Germany. | |
| 57-7148 | 1/1982 | Japan. | |
| 0174759 | 7/1991 | Japan | 257/723 |
| 4-92458 | 3/1992 | Japan | 257/697 |
| 4-76212 | 12/1992 | Japan. | |
| 5-304248 | 11/1993 | Japan. | |

OTHER PUBLICATIONS

Patent Abstracts of Japan, vol. 17, No. 219 (E-1358), Apr. 30, 1993, JP-A-4 354360, Dec. 8, 1992.
Patent Abstracts of Japan, vol. 14, No. 408 (E-972), Sep. 4, 1990, JP-A-2 154457, Jun. 13, 1990.

*Primary Examiner*—Tom Thomas
*Assistant Examiner*—Alexander Oscar Williams
*Attorney, Agent, or Firm*—Oblon, Spivak, McClelland, Maier & Neustadt, P.C.

[57] ABSTRACT

It is an object of the present invention to obtain a power semiconductor device with small size and high reliability in power semiconductor devices having integral structure of case and external connection terminals. A dummy pad (42) having no electric connection with other parts is provided and a terminal end of a connecting wire (46) connecting by sequentially bonding an exposed surface of a connection electrode (43) and a bonding pad (41) of a semiconductor element (40) is bonded thereto. The semiconductor device can be miniaturized without deteriorating electric characteristics and reliability of the semiconductor elements.

16 Claims, 11 Drawing Sheets

SEMICONDUCTOR DEVICE HAVING INTEGRAL STRUCTURE OF CASE AND EXTERNAL CONNECTION TERMINALS

BACKGROUND OF THE INVENTION

1. Field of the Invention

The present invention relates to the structure of semiconductor devices, and particularly to the structure of a power semiconductor device with high reliability and simple manufacturing process.

2. Description of the Background Art

FIG. 15 is a cross-sectional view of a conventional power semiconductor device which is described in Japanese Patent Publication No. 4-76212, for example, and FIG. 16 is a plan view of this device. FIG. 15 is a cross-sectional view taken along the XVI—XVI section of FIG. 16.

In FIG. 15 and FIG. 16, the reference character 1 denotes a frame, the reference character 2 denotes an attaching portion, the reference character 3 denotes an attaching hole, the reference character 4 denotes interconnection pattern, the reference character 5 denotes a ceramics plate as an insulating plate, and the reference character 6 denotes a metal coating as a conductor foil, where the interconnection pattern 4 and the metal coating 6 are directly coupled to the ceramics plate 5 without any intermediate layer, such as solder, to form an insulating board 7. The reference character 8 denotes an external connection electrode and the reference character 9 denotes a semiconductor element, both of which are fixed on the interconnection pattern 4 through a solder layer 10.

The reference character 11 denotes a connecting wire, the reference character 12 denotes soft sealing resin, such as a silicone resin, for protecting the semiconductor elements and the connecting wiring 11, and the reference character 13 denotes hard sealing resin, such as an epoxy resin.

Next, the operation of the conventional power semiconductor device will be described.

In the conventional power semiconductor device, the heat generated in the semiconductor element 9 is radiated to a cooling material to which the semiconductor device is attached, through the solder layer 10, the interconnection pattern 4, the ceramics plate 5 and the metal coating 6. The external connection electrode 8 is also fixed to the insulating board 7 through the solder layer 10. This external connection electrode 8 is fixed with the epoxy resin 13 sealing the surface of the power semiconductor device. Accordingly, if the insulating board 7 is transformed due to the heat generated by the semiconductor element 9, thermal stresses occur in the vicinity of the connection between the insulating board 7 and the external connection electrode 8, which may damage the solder layer 10 or the ceramics plate 5. For the aim of preventing this, the external connection electrode 8 has curved part for absorbing the transformation.

This curved part can not show its effects if fixed with the epoxy resin 13, so the silicone resin 12 is sealed to the upper end of the curved part and the epoxy resin 13 is introduced thereon and sealed. Hence, the height of the curved part for absorbing the transformation is indispensable, which makes it difficult to obtain semiconductor devices with small height. Furthermore, the area of adhesion between the insulating board 7 and the external connection electrode 8 must be large to strengthen the solder joint portion of the external connection electrode 8, which results in a problem in obtaining small-sized semiconductor devices.

To solve such a problem, the structure has recently been introduced in which the case and the external connection terminals are integrally structured so that the external connection terminals are fixed independently of the board and all the interconnections are made by the wire bonding not only between the semiconductor elements and the interconnection pattern but also between the external connection electrodes and the semiconductor elements, so that the transformation of the board caused by the heat generated by the power semiconductor elements fixed to the board will not cause thermal stresses in the vicinity of the joint portions between the insulating board and the external connection electrodes.

As described above, when the structure is introduced, the case and the external connection electrodes being integrally structured and connections being all made by the wire bonding, if the connection ends of the external connection electrodes on the inside of the case protrude like cantilevers, they vibrate in the wire bonding, which is usually made by the ultrasonic pressure connection method, to produce a result that the ultrasonic energy can not be utilized effectively. Therefore, the connection ends of the external connection electrodes on the inside of the case are fixed on the case body.

Accordingly, as the connection ends of the external connection electrodes in the case must be provided adjacent to the inner wall of the case, it is difficult to have sufficient space in the vicinity of the connection ends inside the case. Moreover, since the wire used for bonding of the power semiconductor elements is not a thin gold wire with diameter of about 25 to 30 μm, which is used in usual ICs, but it is an aluminum wire with diameter of about 0.1 mm to 0.5 mm which can not be cut by pulling after the bonding like the gold wire, so that a wire cutter is required and so a space for the wire cutter is needed. Considering this, if the connection end of the external connection electrode on the inside of the case is a second bonding point, the interval between the inner wall of the case and the connection end in the case must be large to have enough space in the vicinity of the connection end inside the case, and then the semiconductor device must be large-sized, too. On the other hand, if the bonding pad on the semiconductor element is used as the second bonding point, a wire cutter must be used above the semiconductor element, which may give damage to the semiconductor element to produce a problem in the point of reliability.

When the case and the external connection terminals are integrally structured, there is no adhesion between the insulating board and the external connection electrodes, so that an increase of local thermal stresses can be prevented, such as those in the adhered portion between the insulating board and the external connection electrodes caused by the heat generated in the power semiconductor elements. If the insulating board is directly attached to a cooling body, however, though there is no increase of local thermal stresses, thermal transformation of the entirety of the insulating board is still caused by the heat generated by the power semiconductor element since the insulating board is a compound plate with materials of different kinds, which may damage the ceramics plate of the insulating plate.

If the structure of directly attaching the insulating board of the semiconductor device to the cooling body is introduced, if the amount of adhesive agent for bonding the insulating board to the frame is in excess even slightly, it flows onto the surface of the insulating board on the side in contact with the cooling body. When it solidifies, contact between the insulating board and the cooling body can not be ensured when the semiconductor device is attached to the cooling body and then the cooling efficiency will decrease, or, the solidified adhesive agent may locally press the insulating board strongly to give damage to the ceramics of the insulating plate.

When the case and the external connection terminals are integrally structured, the silicone resin is sealed to protect the semiconductor elements and the connecting wiring but the epoxy resin is not used since there is no need of holding the external connection terminals. Instead, a lid is provided above the connection ends of the external connection terminals on the inside of the case. If the silicone resin is injected to the level of the lid, an adhesive agent for bonding the lid can not be applied, so that a space must be provided below the lid. Then, if the upper surface of the silicone resin is made as low as possible because it is desired to make the height of the entire semiconductor device as low as possible, the aluminum wire bonded on the connection end of the external connection terminal inside the case may be exposed in the air in this space, and then, it will easy to corrode.

As described above, the conventional semiconductor devices have problems in the point of reliability in manufacturing when they are made to have integrally structured case and external connection terminals with small size.

SUMMARY OF THE INVENTION

According to a first aspect of the present invention, a semiconductor device comprises:(a) an outer surrounding case; the outer surrounding case comprising, (a-1) a frame having a through hole passing through a first surface and a second surface facing each other and having a step portion recessed from the first surface around an opening of the through hole in the first surface, and (a-2) a connection electrode having its part sealed in the frame and having its one end protruding from the second surface of the frame and the other end defining an exposed surface in parallel with the first surface in the through hole, the first surface defining an attaching surface of the semiconductor device, and the semiconductor device further comprises, (b) an insulating board; the insulating board comprising, (b-1) an insulating plate having two main surfaces, (b-2) a first conductor foil provided on one of the main surfaces of the insulating plate to form wiring pattern, and (b-3) a second conductor foil provided on the other one of the main surfaces of the insulating plate, the insulating board being fixed to the step portion of the frame so that the surface of the first conductor foil faces the inside of the through hole of the frame and the surface of the second conductor foil protrudes from the first surface of the frame, and the semiconductor device further comprises, (c) a semiconductor element provided on the wiring pattern and having a bonding pad on its surface; and (d) connecting wire connecting the exposed surface of the connection electrode and the bonding pad of the semiconductor element by bonding, the first conductor foil comprising, (b-2-1) an island-like region on which a terminal end of the connecting wire is bonded and having no electric connection to others.

According to the semiconductor device of the first aspect of the present invention, the island-like region of the wiring pattern is provided on which a terminal end of the one connecting wire for connecting the exposed surface of the connection electrode and the bonding pad of the semiconductor element by bonding is bonded and from which electric connection to other portions is removed, and the wire can be cut at the bonding point in this island-like region. As a result, the exposed surface of the connection electrode and the bonding pad of the semiconductor element do not have to be used as a second bonding point and so the semiconductor device can be miniaturized without deteriorating the electric characteristics and reliability of the semiconductor element.

Preferably, according to the semiconductor device of the present invention, both of the first conductor foil and the second conductor foil are substantially comprised of metal containing copper at least as a principal component.

Preferably, according to the semiconductor device of the present invention, the connecting wire is substantially comprised of aluminum and has a diameter of about 0.1 mm through about 0.5 mm.

Preferably, the semiconductor device of the present invention further comprises (e) a sealing material for filling the inside of the through hole not to expose the semiconductor element, the wiring pattern, the exposed surface and the connecting wire.

Preferably, according to the semiconductor device of the present invention, the sealing material is substantially comprised of epoxy resin.

Preferably, according to the semiconductor device of a second aspect of the present invention, the insulating plate is comprised of a sintered plate of inorganic material.

Accordingly, in the semiconductor device of the second aspect of the present invention, as the insulating plate of the insulating board is an inorganic sintered plate, heat generated by the semiconductor element can be effectively radiated. As a result, the heat radiating area of the insulating plate becomes smaller and the semiconductor device can be miniaturized.

Preferably, according to the semiconductor device of the present invention, the insulating plate is substantially comprised of ceramics.

Preferably, according to the semiconductor device of a third aspect of the present invention, the insulating board is divided into a plurality of divided parts and all of the plurality of divided parts include a part of the insulating plate, a part of the first conductor foil and a part of the second conductor foil, and the semiconductor device further comprises, (e) coupling means for coupling the plurality of divided parts adjacent to each other to absorb thermal expansion of each of the plurality of divided parts.

Accordingly, in the semiconductor device of the third aspect of the present invention, as the insulating board is divided into a plurality of divided parts and the divided parts are respectively coupled by the coupling means to absorb thermal expansion of each of the divided parts, the thermal expansion of the insulating board can be decreased to prevent its transformation and thus to enhance the reliability of the semiconductor device.

Preferably, the semiconductor device according to the present invention further comprises second connecting wiring, with the connecting wire taken as first connecting wire, the second wiring electrically connecting wire patterns of the plurality of divided parts adjacent to each other.

Preferably, according to the semiconductor device of a fourth aspect of the present invention, the coupling means comprises, (e-1) sealing means of liquid material, and the semiconductor device further comprises, (f) a sealing material for sealing the inside of the through hole.

Accordingly, in the semiconductor device of the fourth aspect of the present invention, as the sealing means of a liquid material is provided to the coupling means and the semiconductor device also includes a sealing material for sealing the inside of the side wall, the semiconductor elements and the connecting wire can be stably protected in a long time, so that the reliability of the semiconductor device can be enhanced.

Preferably, according to the semiconductor device of the present invention, the sealing material is substantially comprised of silicone resin.

Preferably, according to the semiconductor device of a fifth aspect of the present invention, the frame defines a peripheral wall surrounding the step portion, the peripheral wall recedes so that a side surface of the insulating board fixed to the step portion and the peripheral wall define a groove portion, and the frame defines a notch portion, communicating with the groove portion and extending to the first surface, in a part of the peripheral wall.

Accordingly, in the semiconductor device of the fifth aspect of the present invention, the groove portion formed of the peripheral wall and the side surface of the insulating board is provided and the notch portion is provided in a part of the peripheral wall, which communicates with this groove portion and passes to the bottom (the first surface) of the frame, excessive part of an adhesive agent for bonding the insulating board can be passed into the notch portion to prevent it from flowing out to the surface of the insulating board. Hence, the adhesive agent will not go round to the surface of the second conductor foil, therefore the device can have good radiating property and enhanced reliability.

Preferably, according to the semiconductor device of a sixth aspect of the present invention, the insulating board defines a corner portion, and the notch portion is provided in a part of the peripheral wall facing the corner portion.

Accordingly, in the semiconductor device of the sixth aspect of the present invention, as the notch portion is arranged in a part of the peripheral wall facing a corner portion of the insulating board, damage to the corner portion of the insulating board can be prevented in handling of bonding the insulating board. Furthermore, as damage to the corners of the insulating board in the semiconductor device after assembled can be prevented, the yield of the products can be increased.

Preferably, according to the semiconductor device of a seventh aspect of the present invention, the peripheral wall is gradually receding from the side surface of the insulating board as it gets closer to the notch portion so that a width of the groove portion increases as it gets closer to the notch portion.

Accordingly, in the semiconductor device of the seventh aspect of the present invention, as the peripheral wall sequentially recedes from the side surface of the insulating board as the peripheral wall gets closer to the notch portion so that the width of the groove increases as it gets closer to the notch portion, the adhesive agent can be passed effectively to the notch portion while positioning of the insulating board is ensured. Hence, the adhesive agent will not go to the surface of the second conductor foil in assembling, so that the device can have good radiating property and high reliability.

Preferably, according to the semiconductor device of an eighth aspect of the present invention, the frame has a recessed surface recessed from the second surface around an opening of the through hole in the second surface, with the step portion taken as a first step portion, the recessed surface defines a second step portion closer to the second surface than the exposed surface, and the connection electrode is provided so that the exposed surface of the connection electrode is closer to the second surface than the bonding pad of the semiconductor element, and the semiconductor device comprises, (e) a sealing material for sealing the inside region of the through hole from the insulating board to the exposed surface, (f) a lid fixed to the second step portion and covering the opening of the through hole in the second surface, and (g) an adhesive agent fixing the lid and integrally covering a part of the connecting wire exposed on the surface of the sealing material.

Accordingly, in the semiconductor device of the eighth aspect of the present invention, the second step portion having a recessed surface recessed from the second surface, the recessed surface closer to the second surface than the exposed surface, is further provided on the periphery in the opening of the second surface and the exposed surface of one end of the connection electrode is arranged closer to the second surface than the bonding pad of the semiconductor element. Further, the inside of the through hole is sealed with the sealing material to this exposed surface and the adhesive agent is provided for fixing the lid provided in the second step portion and integrally covering the connecting wire exposed on the surface of the sealing material. Therefore, the connecting wire is not exposed in the air and corrosion of the connecting wire can be prevented to enhance the reliability of the semiconductor device.

Preferably, according to the semiconductor device of the present invention, the adhesive agent is comprised of a thermosetting adhesive agent.

The present invention is also directed to a method of manufacturing a semiconductor device. According to a ninth aspect of the present invention, the method of manufacturing a semiconductor device comprises the steps of: (a) preparing an outer surrounding case having a frame having a through hole passing through a first surface and a second surface facing each other and having a step portion recessed from the first surface around an opening of the through hole in the first surface, and a connection electrode having its part sealed in the frame and having its one end protruding from the second surface of the frame and the other end defining an exposed surface in parallel with the first surface in the through hole; (b) preparing an insulating board having an insulating plate having two main surfaces, a first conductor foil provided on one of the main surfaces of the insulating plate and a second conductor foil provided on the other one of the main surfaces of the insulating plate; (c) preparing a semiconductor element having a bonding pad on its surface; (d) preparing wire-like connecting wiring; (e) forming wiring pattern by selectively removing the first conductor foil, the step (e) comprising the step of (e-1) forming an island-like region with electric connection to other parts removed as a part of the wiring pattern, the manufacturing method further comprising the steps of, (f) applying solder on the wiring pattern; (g) providing the semiconductor element on the solder; (h) applying an adhesive agent to the step portion; and (i) providing the frame on the insulating board so that the surface of the wiring pattern faces the inside of the through hole of the frame and a peripheral portion of the insulating board engages with the step portion with the adhesive agent applied; the step (i) comprising the step of, (i-1) appropriately pressurizing the frame against the insulating board, and the manufacturing method further comprising the steps of, (j) heating the solder and the adhesive agent to fix the semiconductor element to the wiring pattern and fix the insulating board to the frame after the steps (g) and (i), (k) bonding one end of the connecting wire to the exposed surface of the connection electrode after the step (j); (l) bonding a first point of the connecting wire to the bonding pad of the semiconductor element fixed to the wiring pattern after the step (k); (m) bonding a second point of the connecting wire located on the side farther than the first point from the one end of the connecting wire to the island-like region after the step (l); and (n) cutting the connecting wire in the vicinity of the second point on the opposite side to the first point after the step (m).

Accordingly, in the manufacturing method according to the ninth aspect of the present invention, the terminal end of the integral connecting wire connecting the exposed surface of the connection electrode and the bonding pad of the semiconductor element by bonding is bonded to the island-like region of the wiring pattern with electric connection to other parts removed and it is cut at the bonding point in the island-like region. That is, as the exposed surface of the connection electrode and the bonding pad of the semiconductor element are not used as the second bonding point, semiconductor devices with small size can be manufactured without deteriorating the electric characteristics and the reliability of the semiconductor elements.

Preferably, the method of manufacturing a semiconductor device according to the present invention further comprises the steps of, (o) preparing a sealing material suitable for sealing, and (p) sealing the inside of the through hole with the sealing material not to expose the semiconductor element, the wiring pattern, the exposed surface and the connecting wire after the step (n).

Preferably, according to the method of manufacturing a semiconductor device of a tenth aspect of the present invention, the insulating board prepared in the step (b) is divided into a plurality of divided parts, all of the plurality of divided parts having a part of the insulating plate, a part of the first conductor foil and a part of the second conductor foil, the manufacturing method further comprising the step of, (o) preparing a coupling member capable of coupling the plurality of divided parts to each other to absorb thermal expansion of each of the plurality of divided parts, the step (i) comprising the step of, (i-2) interposing the coupling member between the plurality of divided parts and coupling the plurality of divided parts with the coupling member.

Accordingly, according to the manufacturing method of the tenth aspect of the present invention, the insulating board is divided into a plurality of divided parts and the divided parts are respectively coupled to each other with the coupling means so that the thermal expansion of each of the divided parts is absorbed. Therefore, the thermal expansion of the insulating board can be reduced to prevent its transformation, and to enhance the reliability of the semiconductor device.

Preferably, the method of manufacturing a semiconductor device according to the present invention further comprises the steps of: (p) with the connecting wire taken as a first connecting wire, preparing a second connecting wire; and (q) making a connection between wiring patterns of the plurality of divided parts adjacent to each other with the second connecting wire after the step (j).

Preferably, according to the method of manufacturing a semiconductor device of an eleventh aspect of the present invention, the step (i-2) comprises the step of, (i-2-1) fixing the plurality of divided parts and the coupling member using an adhesive agent, and the manufacturing method further comprises the steps of, (p) preparing a sealing material suitable for sealing; and (o) sealing the inside of the through hole with the sealing material after the step (n).

Accordingly, according to the manufacturing method of the eleventh aspect of the present invention, as the coupling means and the divided parts are bonded with the adhesive agent and the inside of the side wall is sealed with the sealing material, the semiconductor elements and the connecting wire can be stably protected in a long time and the reliability of the semiconductor device can be enhanced.

Preferably, according to the method of manufacturing a semiconductor device of a twelfth aspect of the present invention, the frame of the outer surrounding case prepared in the step (a) defines a peripheral wall surrounding the step portion, the peripheral wall recedes so that the peripheral wall and a side surface of the insulating board fixed to the step portion can define a groove portion, and the frame further defines a notch communicating with the groove portion and passing through to the first surface in a part of the peripheral wall.

Accordingly, in the manufacturing method of the twelfth aspect of the present invention, the groove is formed of the peripheral wall and the side surface of the insulating board when the frame is installed on the insulating board so that it engages with the step portion. Furthermore, the notch portion communicating with this groove portion and extending to the bottom of the frame (the first surface) is provided in a part of the peripheral wall, so the excessive part of the adhesive agent for bonding the insulating board flows into the notch portion when the frame is pressurized against the insulating board and thus it can be prevented from flowing out to the surface of the insulating board. Therefore, since the adhesive agent will not go round to the surface of the second conductor foil, the device has good radiating property and high reliability.

Preferably, according to the method of manufacturing a semiconductor device of a thirteenth aspect of the present invention, the frame of the outer surrounding case prepared in the step (a) has a recessed surface recessed from the second surface around an opening of the through hole in the second surfaces with the step portion taken as a first step portion, the recessed surface defines a second step portion closer to the second surface than the exposed surface, the connection electrode is arranged in the frame so that the exposed surface of the connection electrode is closer to the second surface than the bonding pad of the semiconductor element when the insulating board is fixed to the outer surrounding case, and the manufacturing method further comprises the steps of, (q) preparing a lid capable of engaging with the second step portion to cover the opening of the through hole in the second surface; (r) preparing a sealing material suitable for sealing; (s) sealing the inside region of the through hole from the insulating board to the exposed surface with the sealing material after the step (n); (t) with the adhesive agent taken as a first adhesive agent, applying a second adhesive agent to the second step portion and on the sealing material to cover a portion of the wiring material exposed on the surface of the sealing material; (u) engaging the lid with the second step portion to cover the opening of the through hole in the second surface; and (v) hardening the second adhesive agent.

Accordingly, in the manufacturing method of the thirteenth aspect of the present invention, the inner region of the through hole from the insulating board to the exposed surface is sealed with the sealing material and the second adhesive agent is applied to cover the part of the interconnection material exposed on the surface of the sealing material, and then the lid is fixed by the second adhesive agent with the lid engaging with the second step portion. Hence, the connecting wire is not exposed in the air and corrosion of the connecting wire can be prevented, so that the reliability of the semiconductor device can be enhanced.

Accordingly, it is an object of the present invention to obtain a power semiconductor device with small size and high reliability in power semiconductor devices having integrally structured case and external connection terminals.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
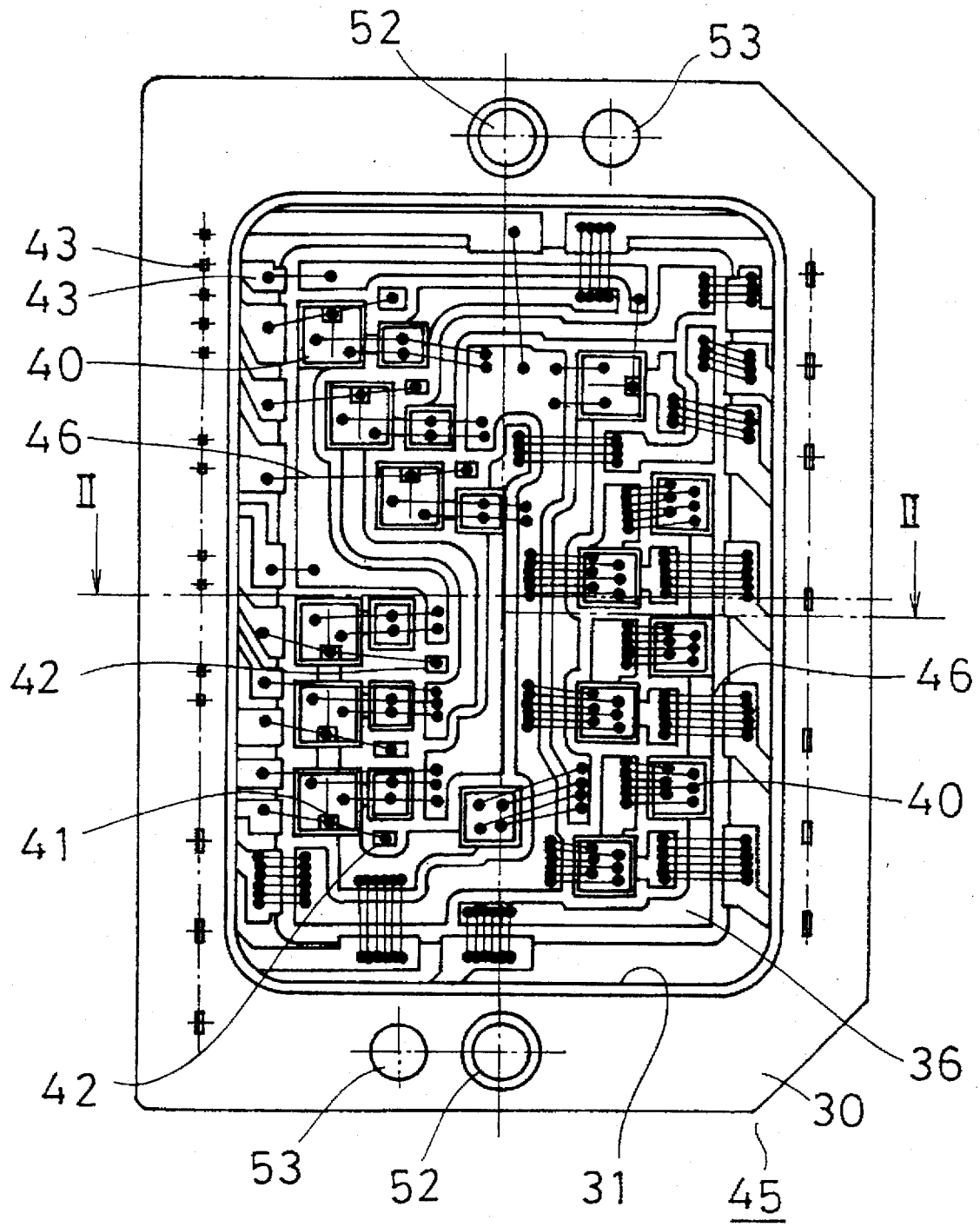
FIG. 1 is a plan view of a semiconductor device of a preferred embodiment of the present invention.
Figure 2:
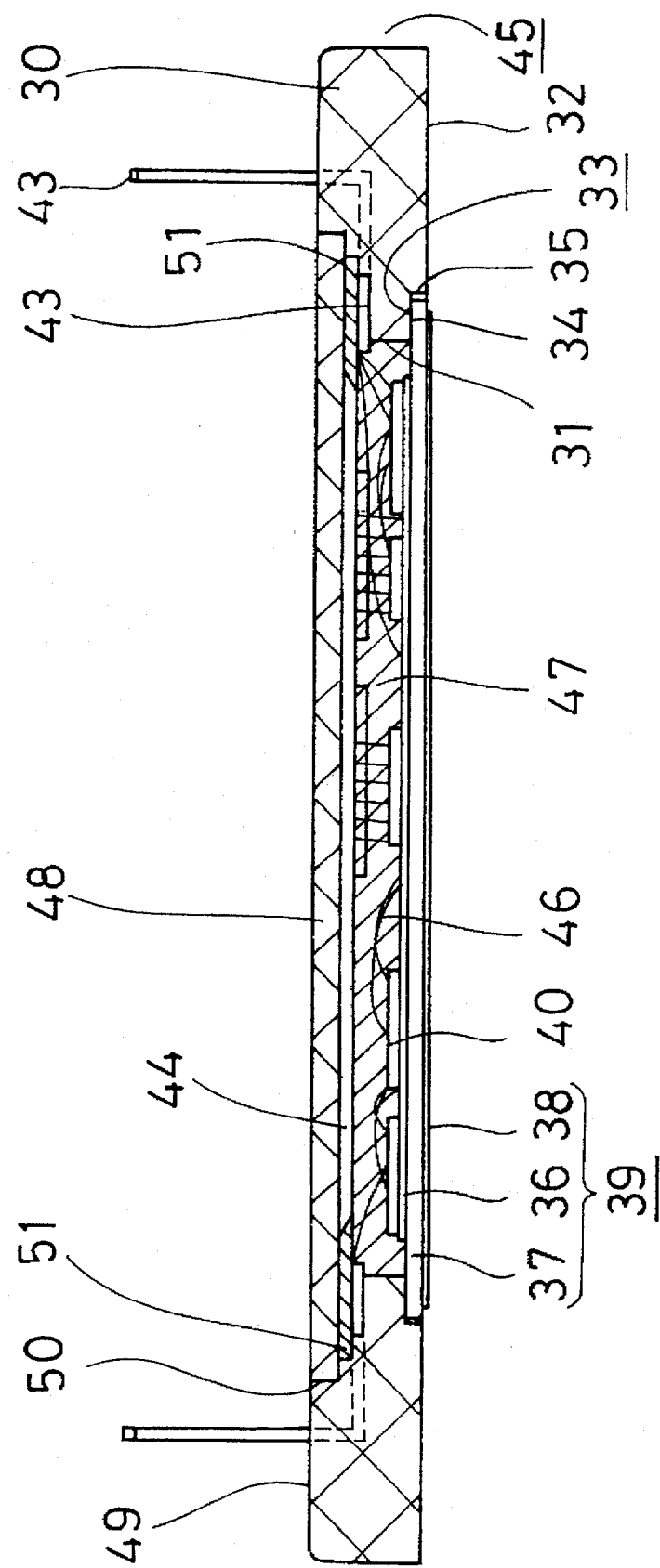
FIG. 2 is a cross-sectional view of the semiconductor device of the preferred embodiment of the present invention.
Figure 3:
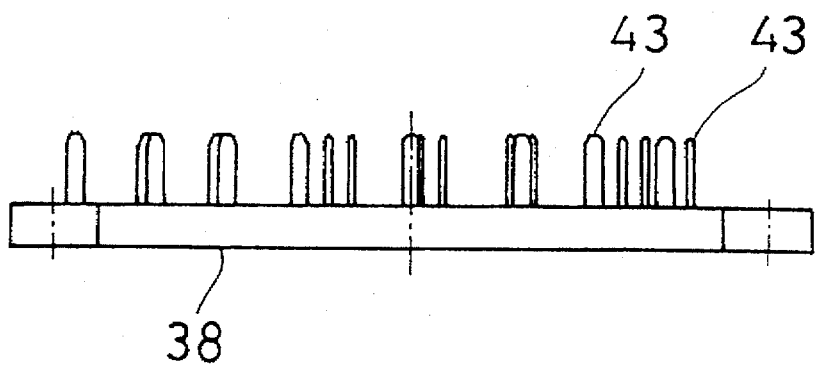
FIG. 3 is a side view of the semiconductor device of the preferred embodiment of the present invention.
Figure 4:
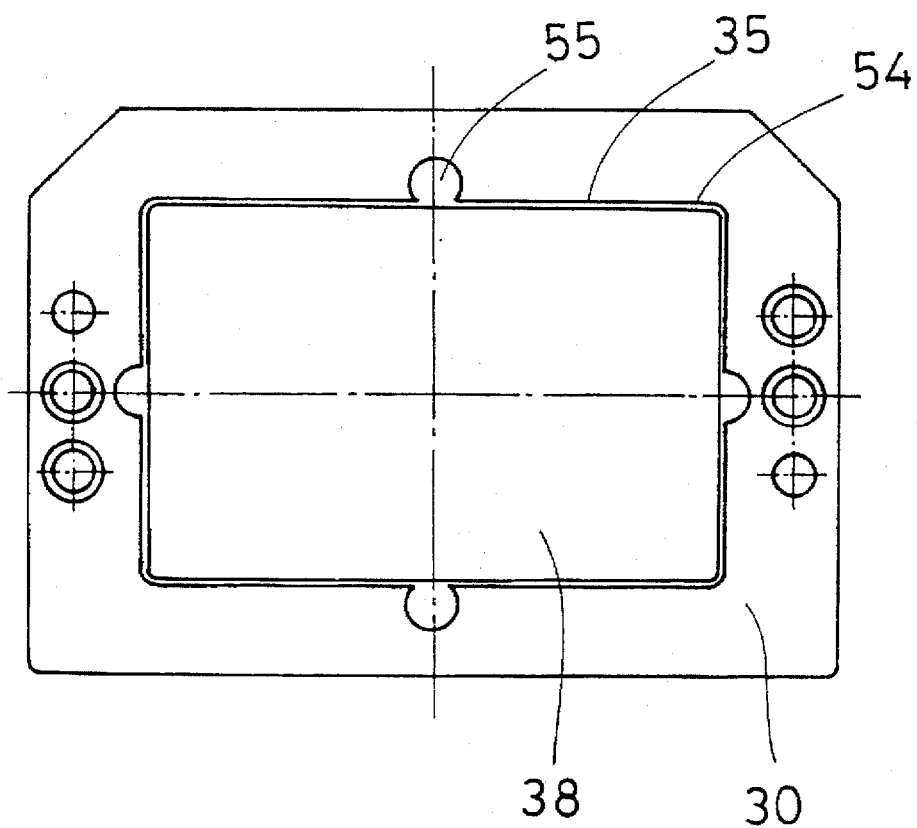
FIG. 4 is a bottom view of the semiconductor device of the preferred embodiment of the present invention.

FIG. 1 is a plan view of a semiconductor device of one preferred embodiment of the present invention. FIG. 1 shows a power semiconductor device as an example, where it is shown with its lid removed to show the inside arrangement of the semiconductor device. FIG. 2 is a cross-sectional view of the semiconductor device of FIG. 1 taken along the II—II section, FIG. 3 is a side view of the semiconductor device of FIG. 1 and FIG. 4 is a bottom view of the semiconductor device of FIG. 1.

In FIG. 1–FIG. 4, the reference character 30 denotes a frame as a framework. This frame 30 is formed of thermoplastic resin by the injection molding. The reference character 31 denotes a through hole, the reference character 32 denotes an attaching surface as a first surface and the reference charter 33 denotes a step portion, which includes a bottom 34 recessed from the attaching surface 32 and a peripheral wall 35. The reference character 36 denotes an wiring pattern as a first conductor foil and the reference character 37 denotes inorganic material sintered plate as an insulating plate. The inorganic material sintered plate 37 is composed of a ceramics plate here. The reference character 38 denotes a metal coating as a second conductor foil, both the wiring pattern 36 and the metal coating 38 being composed of copper system material. The wiring pattern 36, the ceramics plate 37 and the metal coating 38 form the insulating board 39, which is bonded to the bottom 34 of the step portion 33 with the wiring pattern 36 facing to the through hole 31.

As the power semiconductor element reaches a high temperature in use, an elastic and thermosetting silicon system adhesive agent is used as the adhesive. Usually, this insulating board 39 is made by directly joining the metal coating 38 with thickness of about 0.1 mm to 0.4 mm to both surfaces of a ceramics plate with thickness of about 0.5 mm to 1 mm, where at least one of the metal coating is used a the wiring pattern 36.

Semiconductor elements 40 are soldered on the surface of the wiring pattern 36. A bonding pad 41 is provided on the surface of the semiconductor element 40. This semiconductor device is provided with six diodes for converter, six transistors for inverter, six free wheel diodes for invertor, one transistor for brake and one free wheel diode for brake. A dummy pad 42 is an island-like region in the wiring pattern 36, which is not electrically connected to other portions.

The connection electrode 43 to the external interconnection is L-shaped, which is molded to the frame 30. The back side of the inner end, or one end of this connection electrode 43 is seated on the frame 30. The upper surface of the inner end is exposed in the internal space 44 of the frame 30 with its exposed surface on which the interconnection wire is bonded being in parallel with the surface of the wiring pattern 36 of the insulating board 39, and also being in parallel with the attaching surface 32. The other end of the connection electrode 43, or the outer end thereof protrudes as a protruding end on the upper surface 49 of the frame 30 which is the second surface of the frame 30. The connection electrodes 43 and the frame 30 form the outer surrounding case 45.

As the current capacity of the power semiconductor elements is large, aluminum wire with diameter of about 0.1 mm to 0.5 mm is used as the connecting wire 46. The gel-like silicone resin 47 is introduced to the exposed surfaces of the inner ends of the connection electrodes 43 to protect the semiconductor elements 40 and the connection electrodes 43. A lid 48 is bonded to a lid seat 50 which is a second step recessed from the upper surface 49 of the frame 30 with an elastic thermosetting adhesive agent. The adhesive agent 51 bonds the lid 48 to the lid seat 50 and integrally seals the interconnection wiring 43 projecting on the surface of the silicone resin 47.

The reference character 52 denotes an attaching hole of the semiconductor device and the reference character 53 denotes a positioning hole. The reference character 54 denotes an adhesive agent flowing groove, which is formed by the peripheral wall 35 of the step portion 33 of the attaching surface 32 of the semiconductor device and the side surface of the insulating board 39 bonded to the step portion 33. An adhesive agent sink 55 which is a notch is formed like a circular arc to the same depth as the step portion 33, for example, and communicates with the adhesive agent flowing groove 54.

The semiconductor device constituted as described above is manufactured generally as described below.

First, at the same time when the frame 30 is formed by the injection molding, the connection electrodes 43 are inserted and processed and thus the outer surrounding case 45 is prepared. Also, the insulating board 39 is prepared by forming the predetermined wiring pattern 36 in one of the metal coatings of the insulating board as a material. When forming the pattern, the island-like region used as the dummy pad 42 is formed in the vicinity of the pattern of the semiconductor element.

Next, cream solder is applied to the wiring pattern 36 of the insulating board 39, and electric parts, such as the semiconductor elements are provided at predetermined positions.

Next, an adhesive agent is applied to the step portion 33 of the frame 30, and then the outer surrounding case 45 is provided on the insulating board 39 with the wiring pattern 36 of the insulating board 39 facing upwards. It is then somewhat pressurized to press out extra adhesive agent from the adhering plane. Heating process is then performed, and the electronic parts are soldered and the outer surrounding case 45 and the insulating board 39 are joined together.

Subsequently, the semiconductor elements 40, the wiring pattern 36 and the inner ends of the connection electrodes 43 are connected with the connecting wire 46 by the wire bonding according to the ultrasonic pressure connection method. Especially when connecting the semiconductor element 40 and the inner end of the connection electrode 43, the inner end of the connection electrode 43 and the semiconductor element 40 are sequentially connected, the connecting wire 46 is bonded on the dummy pad 42, which is provided in the vicinity of the semiconductor element 40, and then the connecting wire 46 is cut.

After that, the silicone resin 47 is introduced to the exposed surface of the inner ends of the connection electrodes 43 and hardened, and then the adhesive agent 51 is applied to the lid seat 50 to entirely cover the connecting wire 46 bonded on the exposed surfaces of the inner ends of the connection electrodes 43 exposed on the surface of the silicone resin 47, and hardened to bond the lid 48 provided thereon.

Next, the operation thereof will be described.

This semiconductor device is provided with six diodes for semiconductor element converter, six transistors for inverter, six free wheel diodes for inverter, one transistor for brake and one free wheel diode for brake, to which a three-phase AC power supply is connected as an input power supply. It is once converted into a direct current by the converter and then converted into an alternating current with variable frequency by the inverter. It is connected to an electric motor and used as a rotation number controlling power-supply of the electric motor, for example.

As this semiconductor device has its insulating board directly attached to an external cooling body (not shown), the heat generated with the operation of the transistors for the inverter is efficiently radiated to the outside.

The outer surrounding case 45 has the connection electrodes 43 and the frame 30 integrally formed, the connection electrodes 43 having protruding ends arranged along the two sides of the frame 30 facing each other with the through hole 31 interposed therebetween.

As the connection electrodes are sealed with the resin as described above, there is no need of bonding the connection electrodes 43 on the wiring pattern 36 of the insulating board 39 with solder. Accordingly, a large soldering area for supporting the connection electrodes 43 is not required, so that the area of the insulating board 39 is small. Furthermore, it is not necessary for the connection electrodes to have curved portions for absorbing stresses caused by thermal transformation of the insulating board 39, so a semiconductor device with small height can be made.

The connections of the connecting wire 46 are all made by bonding. Especially, when connecting the semiconductor element 40 and the inner end of the connection electrode 43, the connecting wire 46 is first connected with the inner end of the connection electrode 43 used as the first bonding point and then it is bonded to the bonding pad 41 of the semiconductor element 40, and without cutting the connecting wire 46, the connecting wire 46 is further extended and bonded to the dummy pad 42 as the second bonding point and then the connecting wire 46 is cut here. The connection is made in such a way especially when connecting the semiconductor element 40 and the inner end of the connection electrode 43 because of the following reason. If the inner end of the connection electrode 43 is used as the second bonding point, the aluminum wire, or the connecting wire 46 must be cut after bonded to the exposed surface of the inner end of the connection electrode 43. The aluminum wire, in contrast with the gold wire used in usual ICs, can not be pulled and cut, so that a wire cutter must be used.

However, as the inner end of the connection electrode 43 is provided being half buried near the inner wall of the through hole 31 of the frame 30, there is no spacial room for allowing the ultrasonic pressure connection tool and the wire cutter to come near the inner end. Or, to ensure such spacial room, the inner end of the connection electrode 43 must be sufficiently separated away from the side wall of the through hole 31 of the frame 30, which will result in an increase of the outer size of the frame 30.

If the bonding pad 41 of the semiconductor element 40 is used as the second bonding point to avoid it, there is spacial room for allowing the approach of the ultrasonic pressure connection tool and the wire cutter, but the wire cutter must be used on the bonding pad 41 of the semiconductor element 40, which will apply mechanical stresses to the semiconductor element 40 to possibly deteriorate the electric characteristics and reliability of the semiconductor element.

In this preferred embodiment, the dummy pad 42 is provided near the semiconductor element 40 and the connecting wire 46 is cut after the connecting wire 46 is bonded to the dummy pad 42. Therefore, the inner end of the connection electrode 43 and the semiconductor element 40 can be connected without deteriorating the electric characteristics and the reliability of the semiconductor element.

Slightly excessive adhesive agent is usually applied to the step portion 33 of the attaching surface 32 of the semiconductor device to bond the insulating board 39 to the step portion 33, and the excessive part of the adhesive agent is pressed out by somewhat pressing the outer surrounding case 45 when the outer surrounding case 45 is installed on the insulating board 39 so that the excessive part of the adhesive agent will flow into the adhesive agent sink 55 through the adhesive agent flowing groove 54. Therefore, the adhesive agent can be prevented from going round to the lower surface of the metal coating 38 of the insulating board 39 in assembling. If the adhesive agent goes round to the lower surface of the metal coating 38 and solidifies as it is, the adhesive agent remains on the end portion of the metal coating 38. Then, the thermal resistance in this portion increases. Furthermore, the center portion of the metal coating 38 does not come in contact with the cooling body to which it is attached to further increase the thermal resistance and deteriorate radiation of heat of the semiconductor device.

This adhesive agent sink 55 can be provided in any position of the peripheral wall 35.

Figure 5:
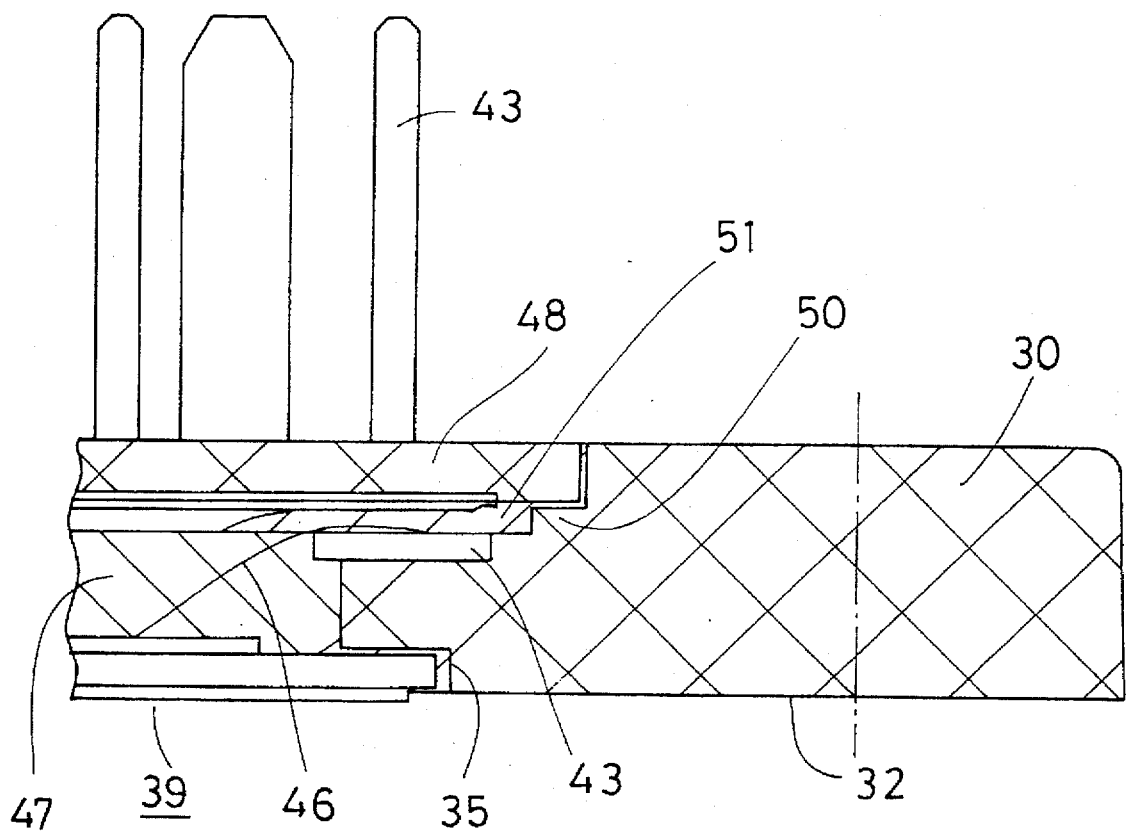
FIG. 5 is a fragmentary cross-sectional view of the semiconductor device of the preferred embodiment of the present invention.

FIG. 5 is a fragmentary cross-sectional view of the semiconductor device of the present invention.

In FIG. 5, the connecting wire 46 bonded on the exposed surface of the inner end of the connection electrode 43 extends above the exposed surface in a gentle arc. If the height of the connection wire 46 from this exposed surface is taken as a loop height, the lid seat 50 is arranged at a level still somewhat higher than the loop height of the exposed surface of the inner end of the connection electrode 43. The positional relation between the lid seat 50 and the exposed surface of the inner end of the connection electrode 43 is thus selected because if the loop height is not ensured the connecting wire 46 is restricted and caused to be cut at a bonding point to ruin the reliability, and if the height is too large the entire height of the semiconductor device increases so that the device can not be made thin.

The connecting wire 46 connected to the exposed surface of the inner end of the connection electrode 43 is exposed above the surface of the silicone resin 47 since the silicone resin 47 is introduced only to the exposed surface of the inner end. When the lid 48 is bonded, the adhesive agent 51 is applied to entirely cover the connecting wire 46 exposed on the surface of the silicone resin 47 and solidified with the lid 48. If the silicone resin 47 is introduced to entirely cover the connecting wire 46, it will overflow from the gap of the lid 48 when the lid 48 is installed to cause a trouble in bonding the lid 48. Accordingly, it is necessary to leave a space between the lid 48 and the silicone resin 47. If the connecting wire 46 is exposed in this space, the aluminum of the connecting wire 46 may be corroded by water in the air to cause a problem in reliability. The corrosion of the connecting wire 46 can be prevented by entirely covering the connecting wire 46 exposed on the surface of the silicone resin 47 with the adhesive agent for bonding the lid 48.

Second Preferred Embodiment

Figure 6:
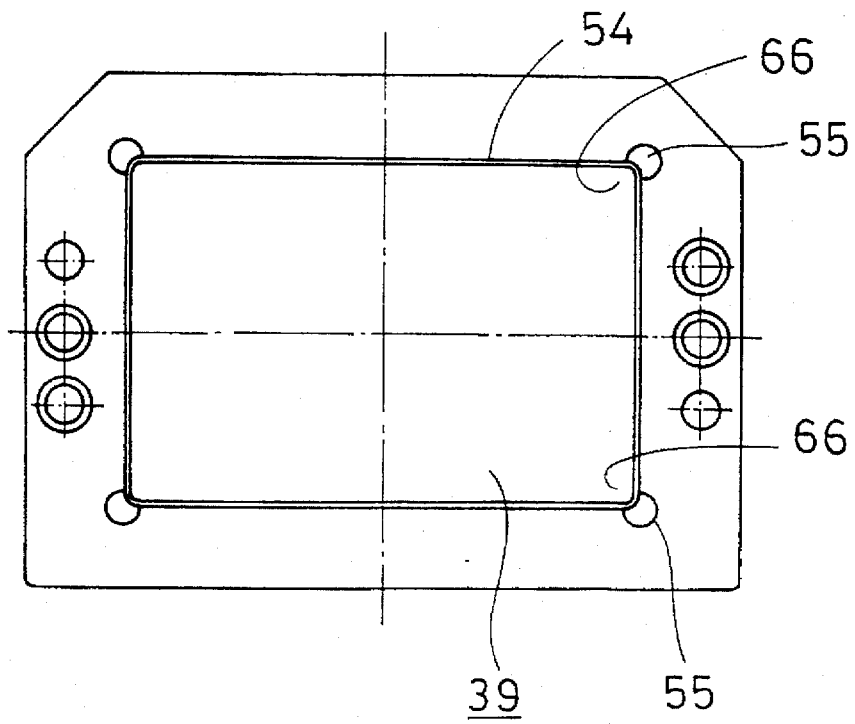
FIG. 6 is a bottom view of a semiconductor device of another preferred embodiment of the present invention.

FIG. 6 is a bottom view showing another preferred embodiment of a semiconductor device of the present invention.

In FIG. 6, the adhesive agent sink 55 is provided in the peripheral wall 35 of the step portion 33 facing the corner portion 66 of the insulating board 39. The structure is the same as that of the first preferred embodiment except providing the adhesive agent sink 55 in this way.

Providing the adhesive agent sink 55 as described above can prevent breakage of the corner portion 66 of the insulating board 39 in addition to allowing the excessive part of the adhesive agent to flow into it. The corner portion 66 of the insulating board 39 is easy to break in handling. If the corner portion 66 is broken when handled in the adhering process, the creeping distance becomes shorter and the dielectric strength is decreased. Furthermore, it avoids direct contact between the corner portion 66 of the insulating board 39 which is most easy to break and the peripheral wall 35 of the step portion 33 to prevent breakage of the corner portion 66 of the insulating board 39 even after the insulating board 39 and the outer surrounding case 45 are joined together and improves the yield of the products.

Third Preferred Embodiment

Figure 7:
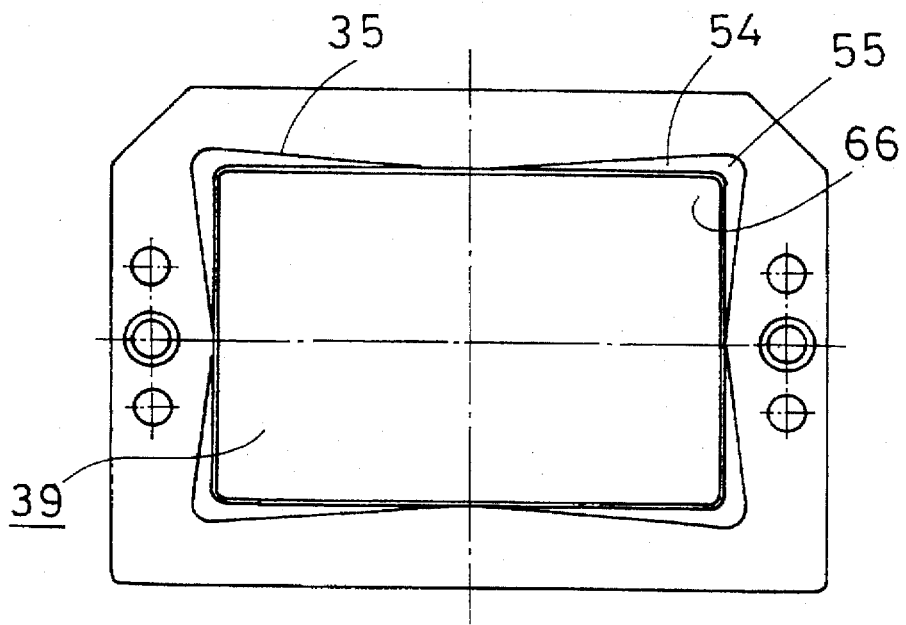
FIG. 7 is a bottom view of a semiconductor device of still another preferred embodiment of the present invention.

FIG. 7 is a bottom view showing still another preferred embodiment of the semiconductor device according to the present invention.

In FIG. 7, the peripheral wall 35 gradually recedes as it gets closer to the adhesive agent sink 55 while positioning the insulating board 39 at center parts of the sides of the peripheral wall 35 to increase the width of the adhesive agent flowing groove 54 for the purpose of facilitating the flow in the adhesive agent flowing groove 54 comprised of the peripheral wall 35 and the side surface of the insulating board 39 into the adhesive agent sink 55.

By making the peripheral wall 35 recede gradually toward the adhesive agent sink 55, the extra adhesive agent can be caused to effectively flow into the adhesive agent sink 55 and it stays there.

Fourth Preferred Embodiment

Figure 8:
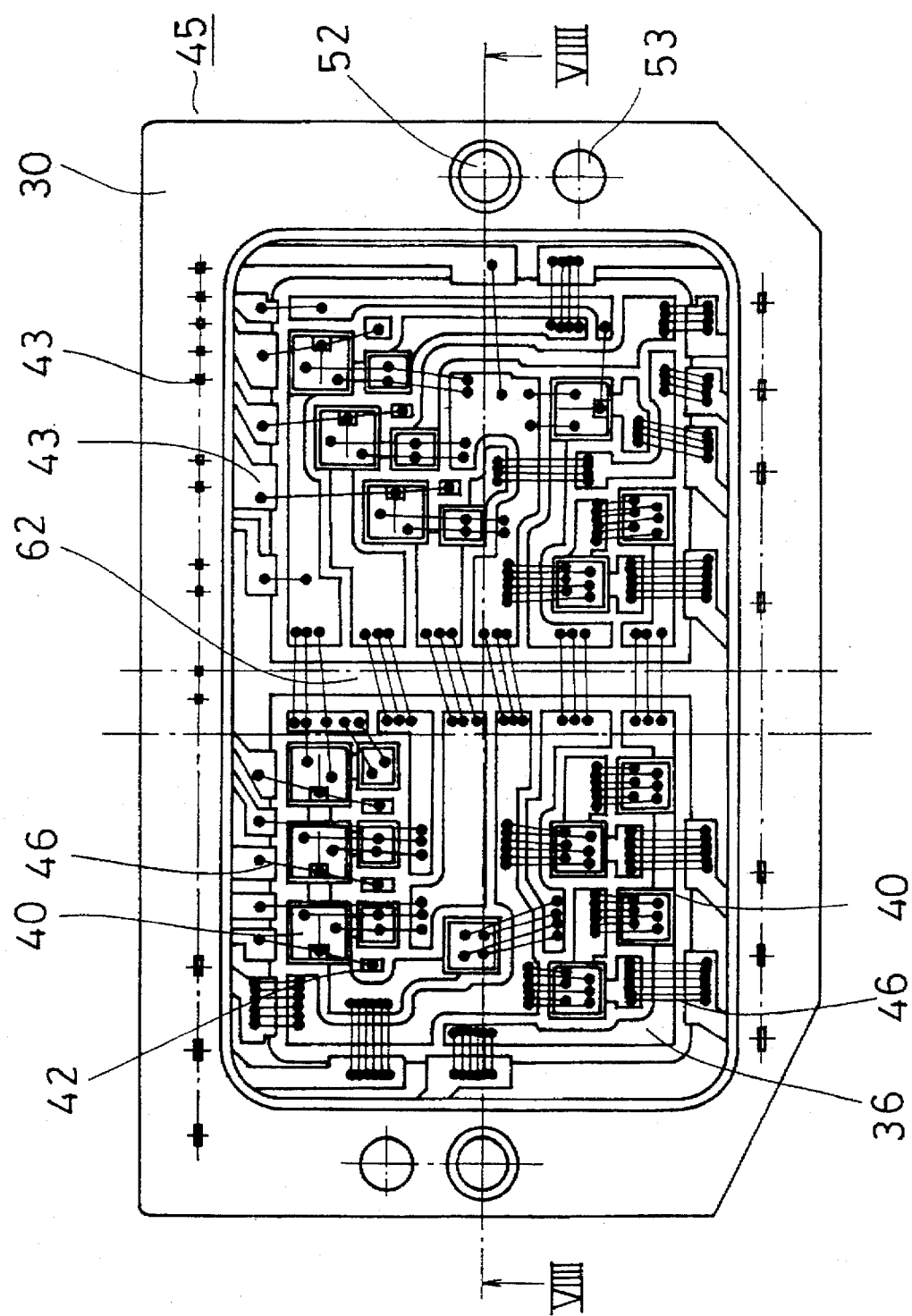
FIG. 8 is a plan view of a semiconductor device of yet another preferred embodiment of the present invention.
Figure 9:
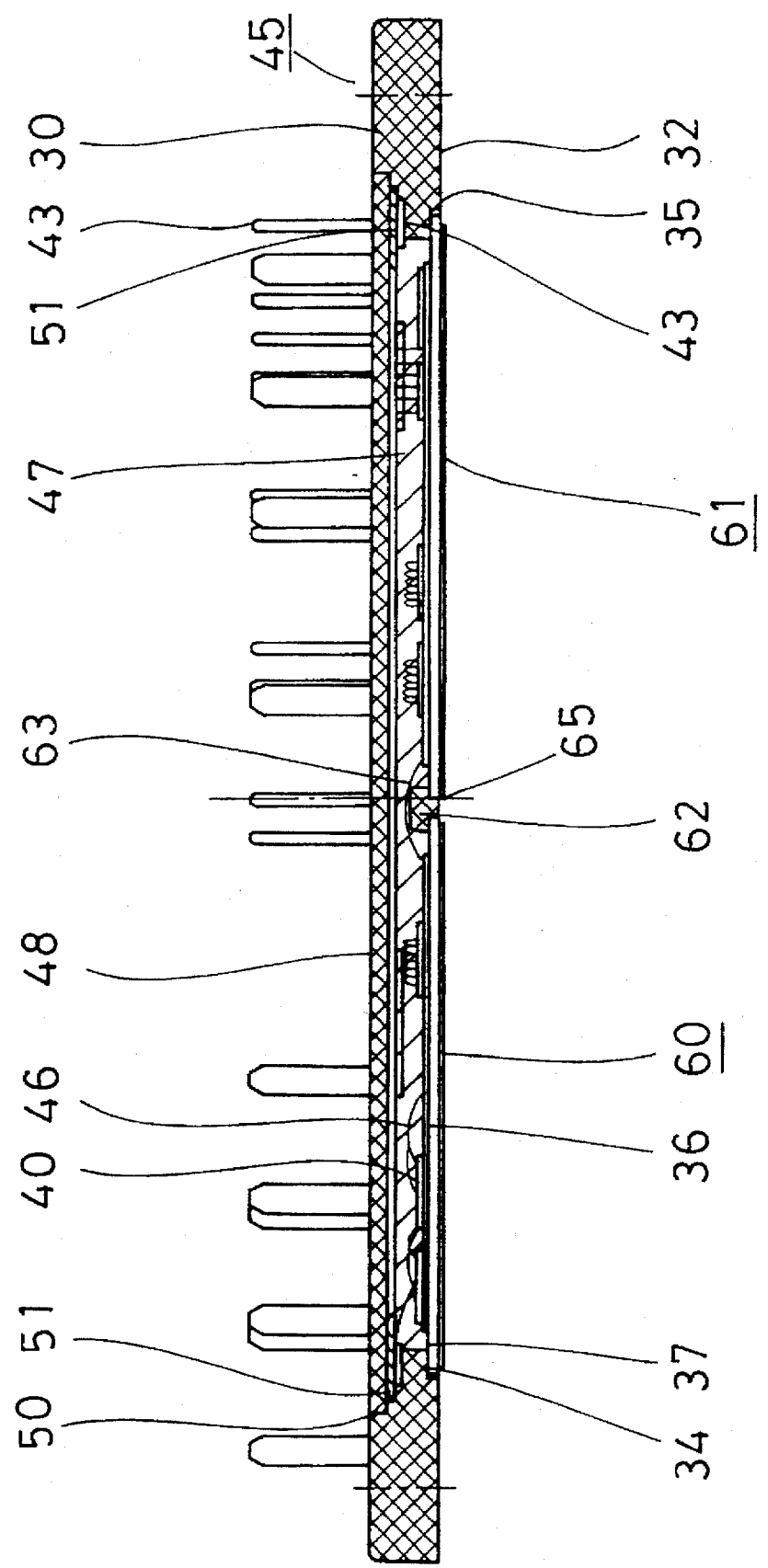
FIG. 9 is a cross-sectional view of the semiconductor device of the yet another preferred embodiment of the present invention.

FIG. 8 is a plan view showing still another preferred embodiment of the semiconductor device according to the present invention, which shows the inside arrangement of the semiconductor device with the lid removed therefrom. FIG. 9 is a cross-sectional view of the semiconductor device of FIG. 8 taken along the VIIII—VIIII section, and FIG. 10 and FIG. 11 are bottom views of the semiconductor device of FIG. 8.

Figure 10:
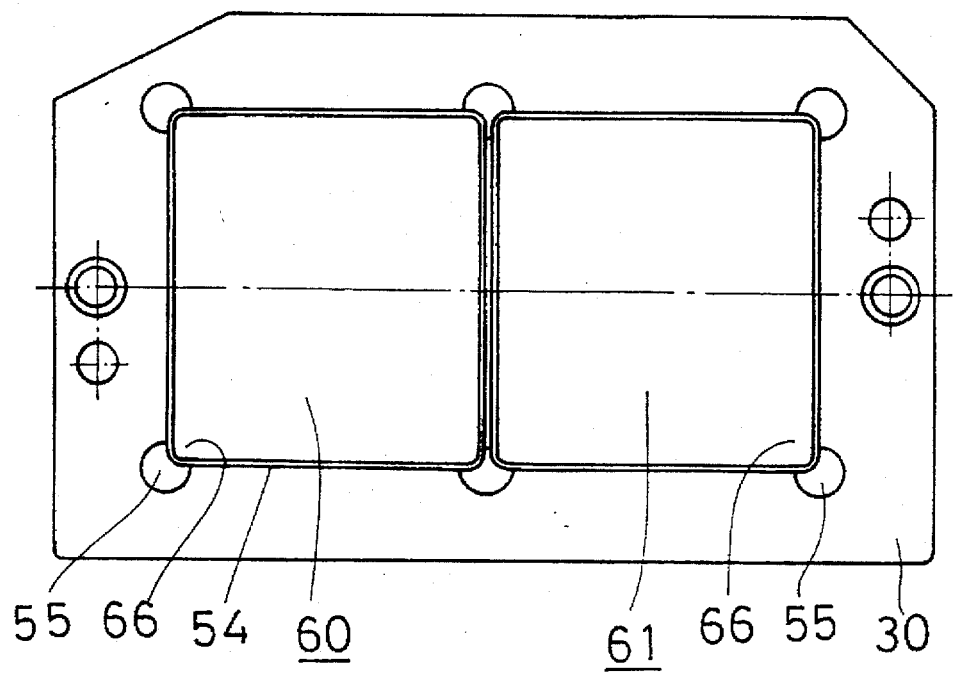
FIG. 10 is a bottom view of the semiconductor device of the yet another preferred embodiment of the present invention.
Figure 11:
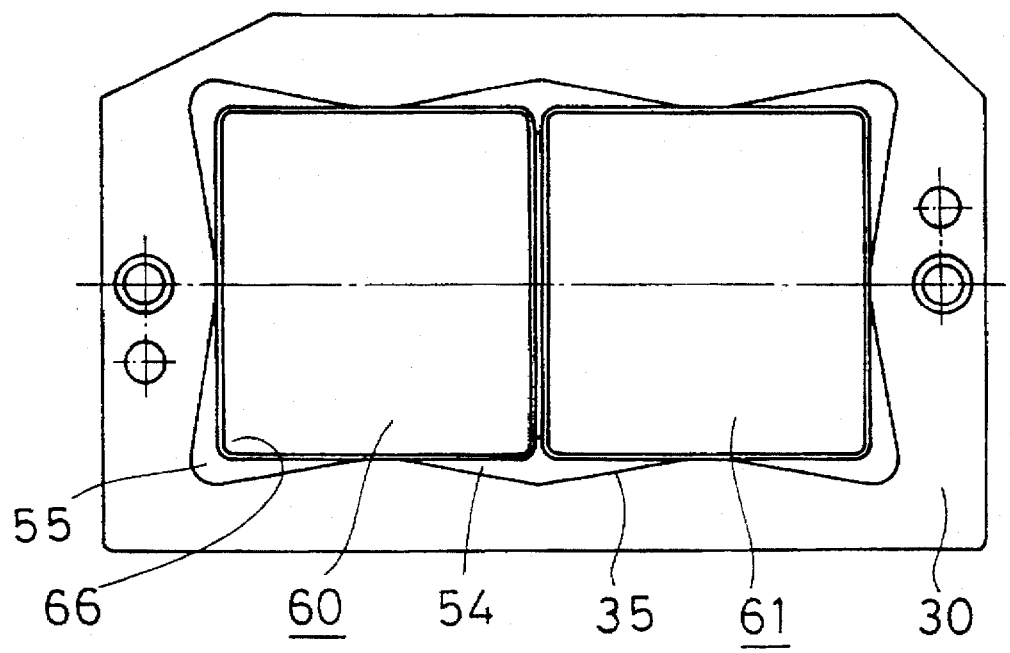
FIG. 11 is a bottom view of the semiconductor device of the yet another preferred embodiment of the present invention.

In FIG. 9 and FIG. 10, the reference character 60 and the reference character 61 denote an insulating board A and an insulating board B, respectively. The reference character 62 denotes a partition plate which is a coupling means between the insulating board A60 and the insulating board B61. The partition plate 62 has a convex-shaped section, which is inserted between the insulating board A60 and the insulating board B61 with the protruding portion interposed therebetween. While realizing a sealing function of sealing the silicone resin 47 with the adhesive agent 65 as sealing means, it fixes the insulating board A60 and the insulating board B61 and bonds the insulating board A60 and the insulating board B61 to the step portion 33. The reference character 63 denotes a junction connecting wire for making an electric connection between the wiring patterns of the insulating board A60 and the insulating board B61, which is connected across the partition plate 62.

As this semiconductor device has the outer surrounding case 45 and the connection electrodes 43 to the outside integrally constructed, there is no bonding portion between the insulating board 39 and the connection electrodes 43 when the insulating board 39 is comprised of a single board as in the first preferred embodiment, and an increase of local thermal stresses can be prevented. However, there still remains a possibility of the heat generated in the provided semiconductor elements 40 causing thermal transformation of the entirety of the insulating board 39, which may give damage to the ceramics plate 37. In this preferred embodiment, the insulating board is divided into the two portions, the insulating board A60 and the insulating board B61, which are coupled together with an elastic adhesive agent using the partition plate 62 to decrease thermal expansion of the respective insulating board A60 and insulating board B61. It prevents thermal transformation of the entire insulating board. Accordingly, the reliability of the semiconductor device against the thermal transformation can be improved.

FIG. 10 shows the structure with the adhesive agent sinks 55 provided in the peripheral wall 35 of the step portion 33, facing the corner potions 66 of the insulating board 39 as described in the second preferred embodiment with the insulating board divided.

FIG. 11 shows the structure with the divided insulating board and the groove having an increased width as described in the third preferred embodiment.

Fifth Preferred Embodiment

Figure 12:
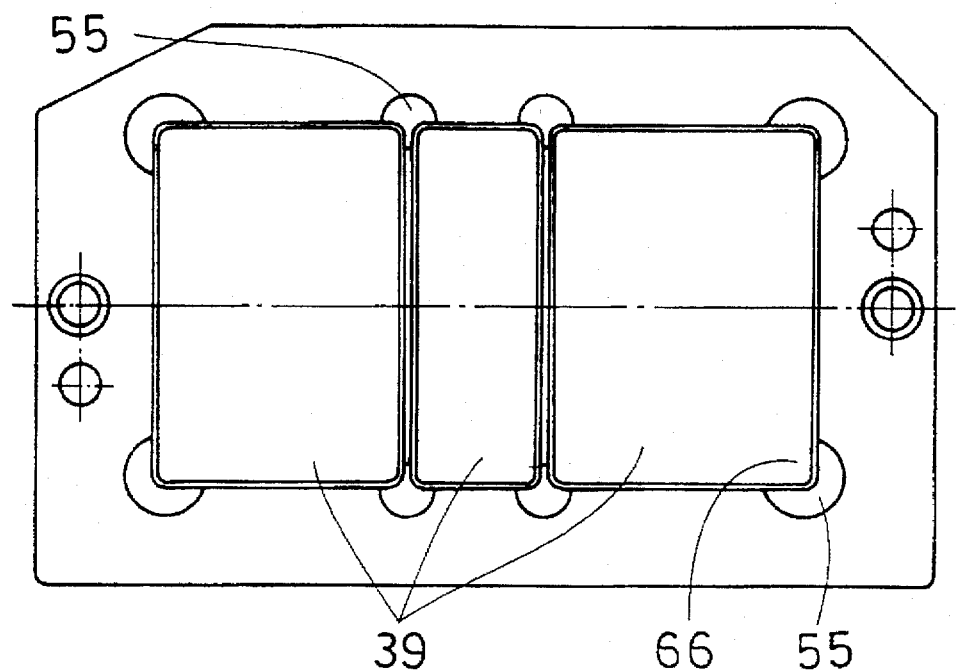
FIG. 12 is a bottom view of a semiconductor device of still another preferred embodiment of the present invention.
Figure 13:
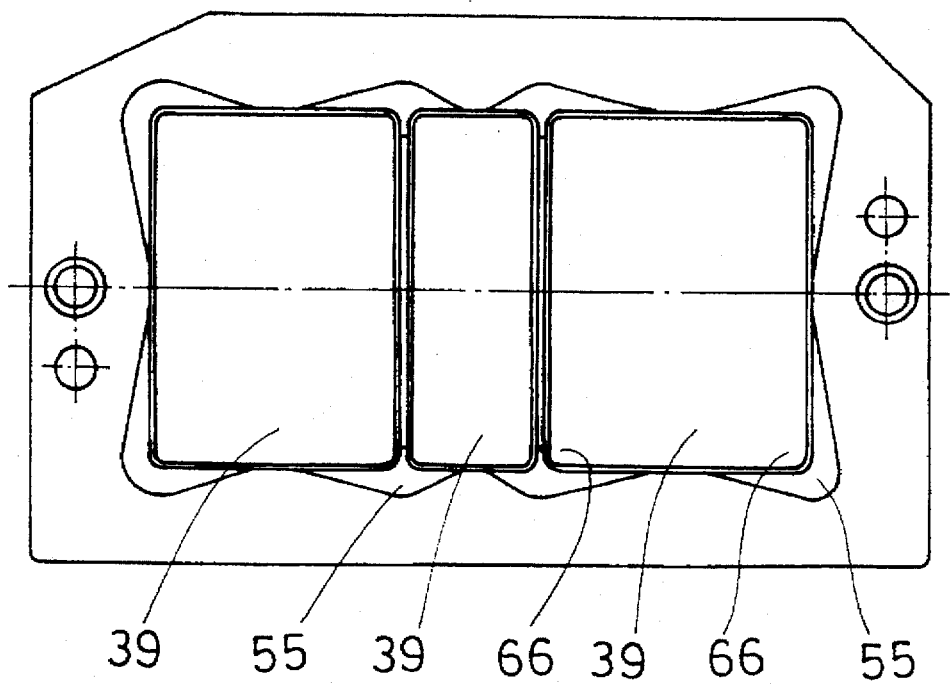
FIG. 13 is a bottom view of the semiconductor device of the still another preferred embodiment of the present invention.

FIG. 12 and FIG. 13 are bottom views showing still another preferred embodiment of the semiconductor device according to the present invention.

FIG. 12 shows the structure in which the insulating board 39 is divided into three and the adhesive agent sinks 55 are provided in the peripheral wall 35 of the step portion 33 facing the corner portions 66 of the insulating boards 39 as described in the second preferred embodiment.

FIG. 13 shows the structure in which the insulating board 39 is divided into three and the width of the groove is increased as described in the third preferred embodiment.

In this preferred embodiment, the insulating board is divided into three. Broadly classified, three kinds of semiconductor elements are used in this semiconductor device. That is to say, they are elements for converter, elements for inverter and elements for brake. The elements for inverter generate the largest amount of heat. Accordingly, it is possible to use a ceramics plate having good thermal conductivity as an insulating plate only for the insulating board provided with the elements for inverter and use a ceramics plate with low price and fair thermal conductivity as an insulating plate of an insulating board provided with other elements, which enables manufacturing of the semiconductor devices with low cost.

Sixth Preferred Embodiment

Figure 14:
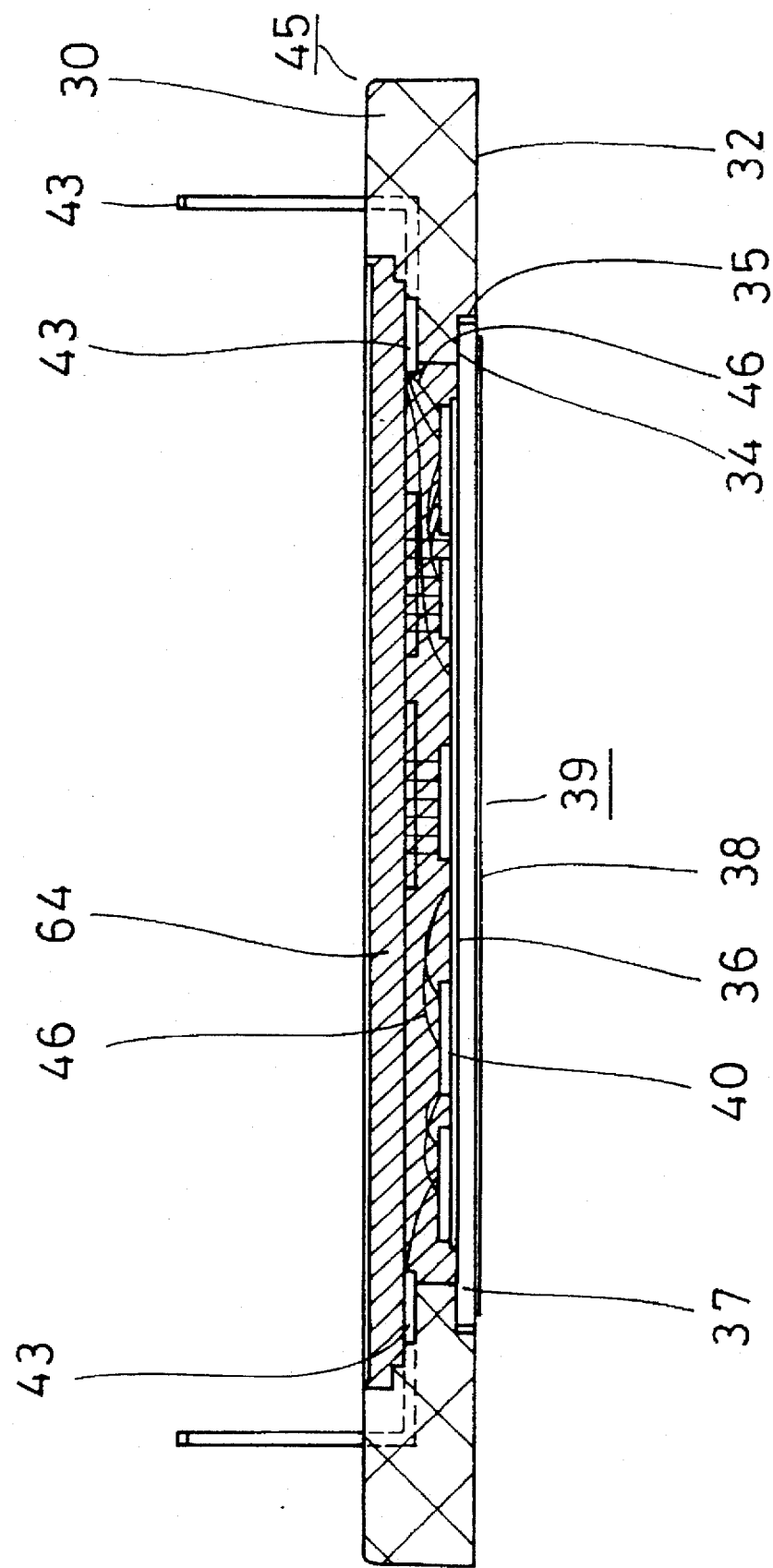
FIG. 14 is a cross-sectional view of a semiconductor device of yet another preferred embodiment of the present invention.
Figure 15:
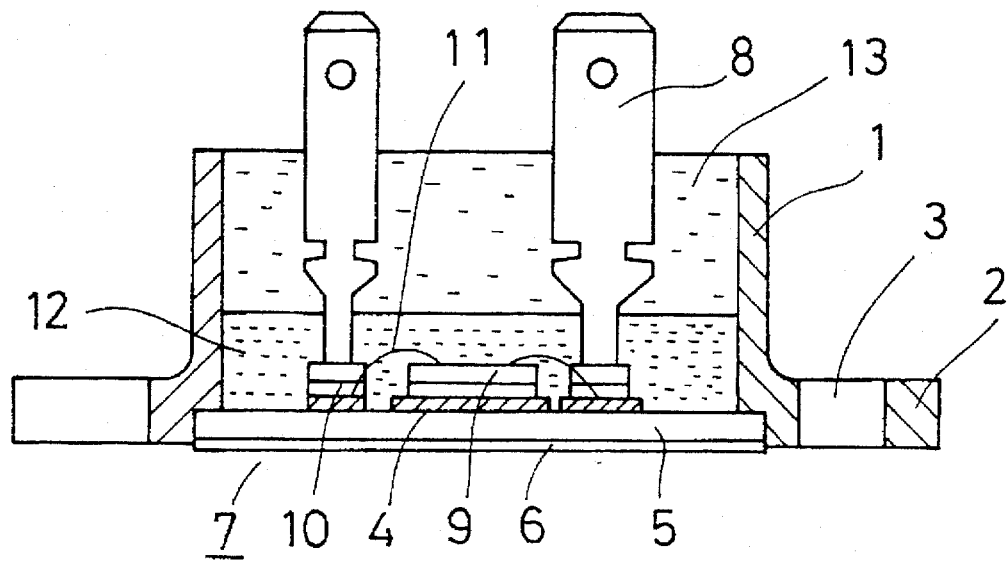
FIG. 15 is a plan view of a conventional semiconductor device.
Figure 16:
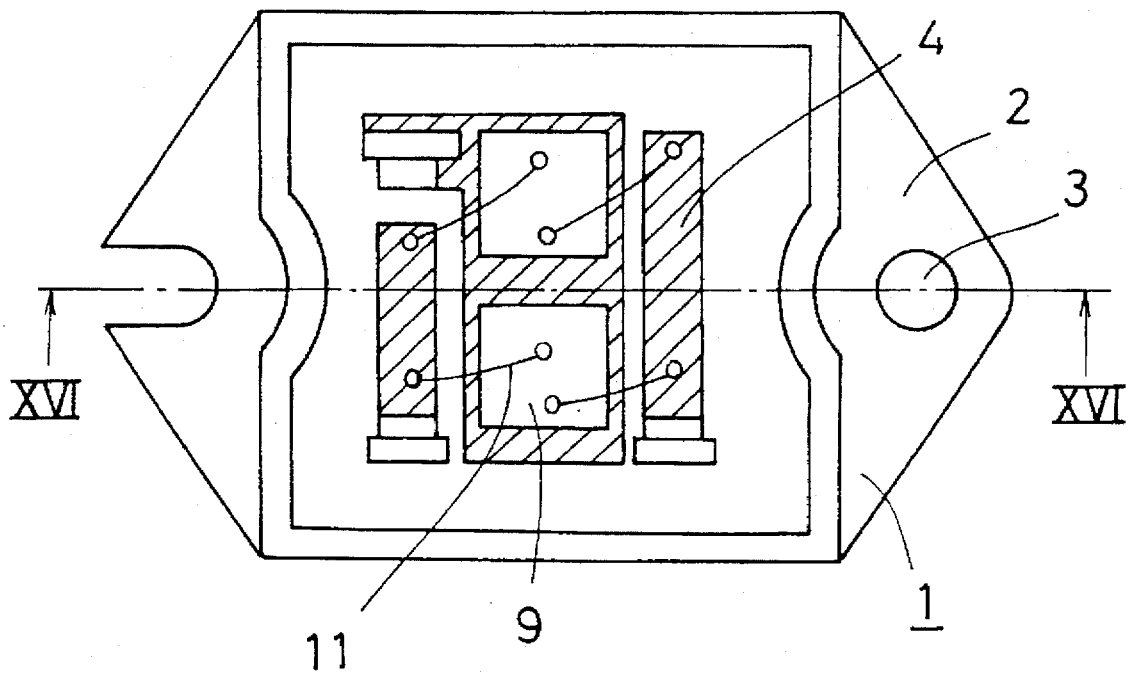
FIG. 16 is a cross-sectional view of the conventional semiconductor device.

FIG. 14 is a cross-sectional view showing still another preferred embodiment of the semiconductor device according to this invention.

As shown in FIG. 14, the epoxy resin 64 is introduced and hardened in place of the silicone resin 47 to protect the semiconductor elements 40 and the connecting wire 46 and to seal the surface of the semiconductor device in place of the lid 48. The structure is the same as that of the first preferred embodiment except the sealing of the surface by the epoxy resin 64.

As the thermosetting epoxy resin has better heat conducting property than that of the silicone resin 47, heat can be radiated not only to the insulating board side but also to the epoxy side and the heat radiating property is improved.

Although the description has been made on the power semiconductor device as an example in the respective preferred embodiments above, it is a matter of course that the same can be utilized in other semiconductor devices.

While the invention has been described in detail, the foregoing description is in all aspects illustrative and not restrictive. It is understood that numerous other modifications and variations can be devised without departing from the scope of the invention.

We claim:

1. A semiconductor device, comprising:
   (a) an outer surrounding case;
   the outer surrounding case comprising,
      (a-1) a frame having a through hole passing through a first surface and a second surface facing each other and having a step portion recessed from the first surface around an opening of the through hole in said first surface, and
      (a-2) a connection electrode having its part sealed in said frame and having its one end protruding from the second surface of the frame and the other end defining an exposed surface in parallel with the first surface in the through hole,
   said first surface defining an attaching surface of the semiconductor device,
   said semiconductor device further comprising,
   (b) an insulating board;
   said insulating board comprising,
      (b-1) an insulating plate having two main surfaces,
      (b-2) a first conductor foil provided on one of the main surfaces of said insulating plate and forming wiring pattern, and
      (b-3) a second conductor foil provided on the other one of the main surfaces of said insulating plate,
   said insulating board being fixed to said step portion of said frame so that the surface of said first conductor foil faces the inside of the through hole of said frame and the surface of said second conductor foil protrudes from the first surface of said frame,
   said semiconductor device further comprising,
   (c) a semiconductor element provided on said wiring pattern and having a bonding pad on the surface; and
   (d) a connecting wire connecting said exposed surface of said connection electrode and said bonding pad of said semiconductor element by bonding; and
   said first conductor foil comprising,
      (b-2-1) an island-like region on which a terminal end of said connecting wire is bonded and having no electric connection to others.

2. The semiconductor device according to claim 1, wherein both of said first conductor foil and said second conductor foil are substantially comprised of metal containing copper at least as a principal component.

3. The semiconductor device according to claim 2, wherein said connecting wire is substantially comprised of aluminum and has a diameter of about 0.1 mm through about 0.5 mm.

4. The semiconductor device according to claim 3, further comprising (e) a sealing material for filling the inside of said through hole not to expose said semiconductor element, said wiring pattern, said exposed surface and said connecting wiring.

5. The semiconductor device according to claim 4, wherein said sealing material is substantially comprised of epoxy resin.

6. The semiconductor device according to claim 1, wherein said insulating plate is comprised of a sintered plate of inorganic material.

7. The semiconductor device according to claim 6, wherein said insulating plate is substantially comprised of ceramics.

8. The semiconductor device according to claim 1, wherein said insulating board is divided into a plurality of divided parts and all of the plurality of divided parts include a part of said insulating plate, a part of said first conductor foil and a part of said second conductor foil, and said semiconductor device further comprises,
   (e) coupling means for coupling said plurality of divided parts adjacent to each other to absorb thermal expansion of each of said plurality of divided parts.

9. The semiconductor device according to claim 8, wherein, with said connecting wire taken as first connecting wiring, said semiconductor device further comprises second connecting wiring,
   said second connecting wire electrically connecting wire patterns of said plurality of divided parts adjacent to each other.

10. The semiconductor device according to claim 8, wherein said coupling means comprises, (e-1) sealing means of liquid material, and said semiconductor device further comprises, (f) a sealing material for sealing the inside of said through hole.

11. The semiconductor device according to claim 10, wherein said sealing material is substantially comprised of silicone resin.

12. The semiconductor device according to claim 1, wherein said frame defines a peripheral wall surrounding said step portion, said peripheral wall recedes so that a side surface of said insulating board fixed to said step portion and said peripheral wall define a groove portion, and said frame defines a notch portion communicating with said groove portion and extending to said first surface in a part of said peripheral wall.

13. The semiconductor device according to claim 12, wherein said insulating board defines a corner portion, and said notch portion is provided in a part of said peripheral wall facing said corner portion.

14. The semiconductor device according to claim 12, wherein said peripheral wall gradually recedes from said side surface of said insulating board as it gets closer to said notch portion so that a groove width of said groove portion increases as it gets closer to said notch portion.

15. The semiconductor device according to claim 1, wherein said frame has a recessed surface recessed from said second surface around an opening of said through hole in said second surface, with said step portion taken as a first step portion, said recessed surface defines a second step portion closer to said second surface than said exposed surface, said connection electrode is provided so that said exposed surface of said connection electrode is closer to said second surface than said bonding pad of said semiconductor element, and said semiconductor device comprises, (e) a sealing material for sealing the inside region of said through hole from said insulating board to said exposed surface, (f) a lid fixed to said second step portion and covering the opening of said through hole in said second surface, and (g) an adhesive agent fixing said lid and integrally covering an exposed part of said connecting wire on the surface of said sealing material.

16. The semiconductor device according to claim 15, wherein said adhesive agent is comprised of a thermosetting adhesive agent.

* * * * *